US010134637B1

(12) United States Patent
John

(10) Patent No.: US 10,134,637 B1
(45) Date of Patent: Nov. 20, 2018

(54) METHOD OF FORMING A SEMICONDUCTOR COMPONENT HAVING MULTIPLE BIPOLAR TRANSISTORS WITH DIFFERENT CHARACTERISTICS

(71) Applicant: NXP USA, Inc., Austin, TX (US)

(72) Inventor: Jay Paul John, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/827,125

(22) Filed: Nov. 30, 2017

(51) Int. Cl.

| | |
|---|---|
| ***H01L 21/8228*** | (2006.01) |
| ***H01L 29/66*** | (2006.01) |
| ***H01L 27/082*** | (2006.01) |
| ***H01L 29/737*** | (2006.01) |
| ***H01L 29/165*** | (2006.01) |

(52) U.S. Cl.
CPC .... *H01L 21/82285* (2013.01); *H01L 27/0826* (2013.01); *H01L 29/165* (2013.01); *H01L 29/66242* (2013.01); *H01L 29/7371* (2013.01)

(58) Field of Classification Search
CPC ............. H01L 21/82285; H01L 29/165; H01L 29/7371; H01L 29/66242; H01L 27/0826
See application file for complete search history.

(56) References Cited

U.S. PATENT DOCUMENTS

| | | | |
|---|---|---|---|
| 7,064,416 B2 | 6/2006 | Dunn et al. | |
| 7,144,789 B2 | 12/2006 | El-Kareh et al. | |
| 7,611,955 B2 | 11/2009 | John et al. | |
| 2002/0070410 A1* | 6/2002 | Freeman ............. | H01L 21/8222 257/370 |
| 2004/0135137 A1 | 7/2004 | Freeman | |
| 2010/0019326 A1* | 1/2010 | Knoll ................ | H01L 21/82285 257/370 |
| 2013/0032891 A1 | 2/2013 | Mertens et al. | |

* cited by examiner

*Primary Examiner* — Karen Kusumakar
(74) *Attorney, Agent, or Firm* — Charlene R. Jacobsen

(57) ABSTRACT

A semiconductor component is formed by providing a substrate having partially formed first and second transistors, a base electrode stack formed over the transistors, first and second emitter windows formed in the electrode stack over first and second collector regions of the transistors, and an oxide layer extending over the collector regions. A process entails forming a mask layer in a selected emitter window, optionally forming a selectively implanted collector (SIC) in an un-masked emitter window, and removing an oxide layer and forming an epitaxial layer in the un-masked emitter window. The process further entails forming an oxide layer over the epitaxial layer and repeating the operations of forming a mask layer for another selected emitter window, optionally forming a SIC in another un-masked emitter window, and removing an oxide layer and forming an epitaxial layer in the un-masked emitter window. The epitaxial layers may have different epitaxial growth profiles.

20 Claims, 17 Drawing Sheets

116
PROVIDE SUBSTRATE WITH PARTIALLY FORMED TRANSISTORS 118
FORM MASK LAYER IN SELECTED EMITTER WINDOW 120
OPTIONAL: FORM SELECTIVELY IMPLANTED COLLECTOR IN UN-MASKED EMITTER WINDOW INCORPORATING SELECTED DOPING PROFILE 122
REMOVE OXIDE LAYER IN UN-MASKED EMITTER WINDOW(S) 124
REMOVE MASK LAYER 126
A
FORM EPITAXIAL LAYER IN UN-MASKED EMITTER WINDOW WITH SELECTED EPITAXIAL GROWTH PROFILE 128
CONTINUE? 130 Y N
FORM OXIDE LAYER OVER EPITAXIAL LAYER 132
REMOVE OXIDE LAYER FROM EPITAXIAL LAYER 134
CONTINUED PROCESSING 136

20
24
26
22
27
28
30
32
34
36
38
40
42
44
46
48
50
52
54
56
58
60
62
64

26
24
20
22
27
28
30
32
34
36
38
40
42
44
46
48
50
52
54
56
58
60
62
64
66
68

20
22
27
34
36
44
50
56
54
52
48
24
26
30
32
28
60
64
70
38
40
42
46
62
66
68
58

20
22
24
26
27
28
30
32
34
36
38
40
42
44
46
48
50
52
54
56
58
60
62
64
68
70

20
24
26
22
27
28
30
32
34
36
38
40
42
44
46
48
50
52
54
56
58
60
62
64
68
70
72
74
76
78

26
24
20
80
50
56
54
52
48
44
34
36
27
22
40
30
64
62
60
46
72
42
32
38
28

26
24
48
52
54
56
50
80
44
34
36
27
22
40
64
62
46
42
38
20
30
82
84
60
72
32
28

20
24
26
22
27
28
30
32
34
36
38
40
42
44
48
50
52
54
56
60
62
64
72
80
82
84
86
88

20
24
26
22
27
28
30
32
34
36
38
40
42
44
48
50
52
54
56
60
62
64
72
80
84
86
88

26
54
56
50
44
34
36
27
22
48
52
64
62
90
40
42
88
38
86
20
24
30
60
72
32
28

24
26
20
22
27
28
30
32
34
36
38
40
42
44
48
50
52
54
56
60
62
72
86
90
98
100
102
104

26
24
110
108
106
100
102
98
62
60
104
90
72
38
28
86
42
32
20
36
27
22
44
34
40
30

26
24
20
22
27
34
36
40
44
30
32
28
38
42
46
48
50
52
54
56
58
60
62
66
68
114

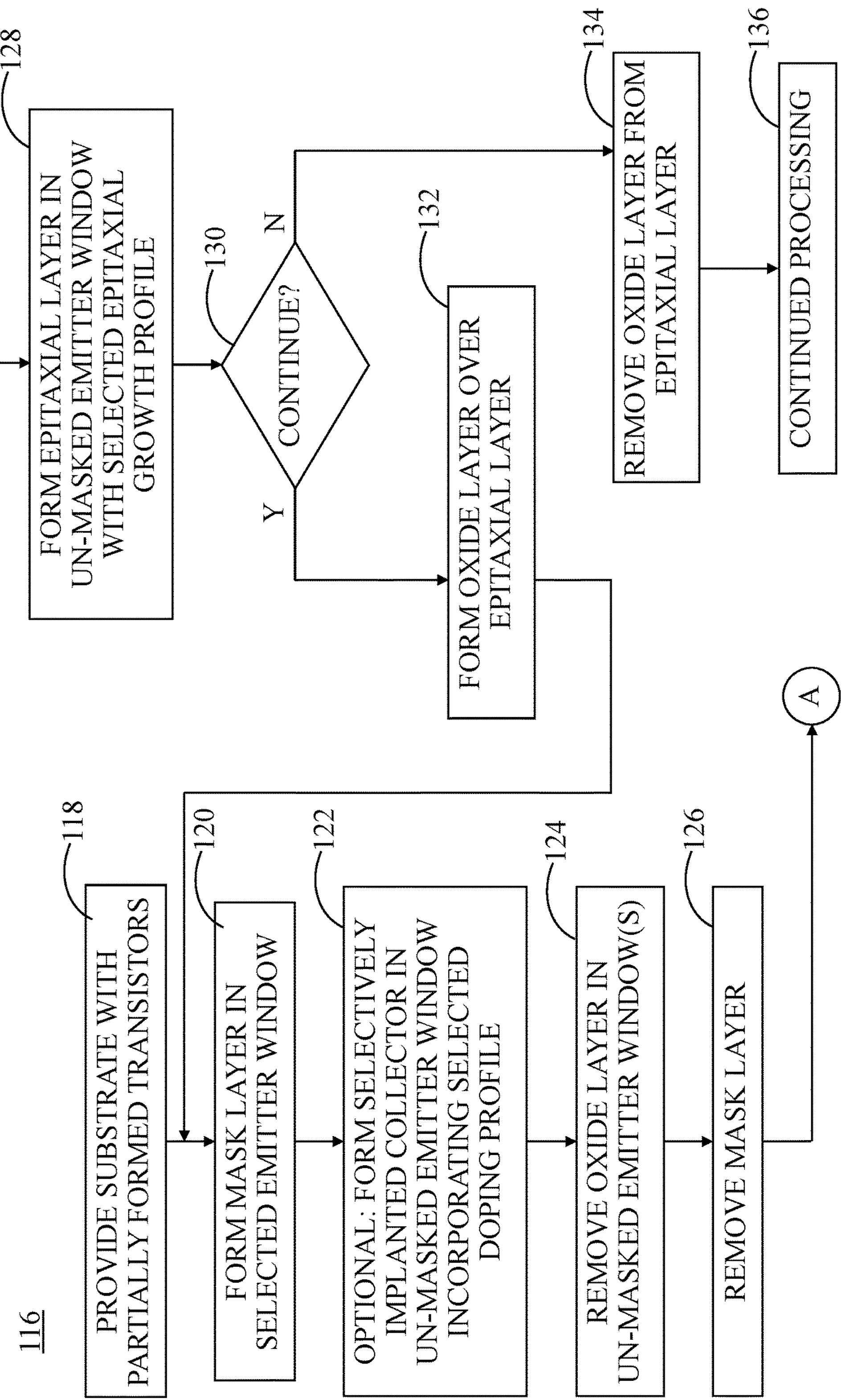
FIG. 17
116
PROVIDE SUBSTRATE WITH PARTIALLY FORMED TRANSISTORS
118
FORM MASK LAYER IN SELECTED EMITTER WINDOW
120
OPTIONAL: FORM SELECTIVELY IMPLANTED COLLECTOR IN UN-MASKED EMITTER WINDOW INCORPORATING SELECTED DOPING PROFILE
122
REMOVE OXIDE LAYER IN UN-MASKED EMITTER WINDOW(S)
124
REMOVE MASK LAYER
126
A
A
FORM EPITAXIAL LAYER IN UN-MASKED EMITTER WINDOW WITH SELECTED EPITAXIAL GROWTH PROFILE
128
CONTINUE?
130
Y
N
FORM OXIDE LAYER OVER EPITAXIAL LAYER
132
REMOVE OXIDE LAYER FROM EPITAXIAL LAYER
134
CONTINUED PROCESSING
136

METHOD OF FORMING A SEMICONDUCTOR COMPONENT HAVING MULTIPLE BIPOLAR TRANSISTORS WITH DIFFERENT CHARACTERISTICS

TECHNICAL FIELD OF THE INVENTION

The present invention relates generally to semiconductor components. More specifically, the present invention relates to a method of forming a semiconductor component having multiple bipolar transistors with different characteristics.

BACKGROUND OF THE INVENTION

In a highly integrated semiconductor component (such as a radio frequency (RF) circuit), different circuit blocks such as a power amplifier, a mixer, a voltage controlled oscillator (VCO), and so forth may benefit from bipolar transistors having different characteristics. These different characteristics include, for example, current gain (Beta), unity current gain frequency (fT), maximum oscillation frequency (fMAx), bipolar transistor base resistance (RB), bipolar transistor collector-base junction capacitance (CJC), bipolar transistor emitter-base junction capacitance (CJE), breakdown voltages (BVCBO), and so forth.

A number of silicon-based products operating in the high frequency bands use silicon germanium bipolar complementary metal oxide semiconductor (SiGe BiCMOS) technologies. An approach in a SiGe BiCMOS process to provide multiple bipolar transistor characteristics can be through the modulation of the collector doping using a specific mask in order to tailor the collector doping profile to achieve transistors with different breakdown voltages (BVCBO). However, the main characteristics of a SiGe heterojunction bipolar transistor (HBT) are determined by the base doping profile, which is a function of the dopants introduced during the epitaxial base growth.

BRIEF DESCRIPTION OF THE DRAWINGS

The accompanying figures in which like reference numerals refer to identical or functionally similar elements throughout the separate views, the figures are not necessarily drawn to scale, and which together with the detailed description below are incorporated in and form part of the specification, serve to further illustrate various embodiments and to explain various principles and advantages all in accordance with the present invention.

FIG. 17 shows a flowchart for a method of manufacturing a semiconductor component in accordance with an embodiment.

DETAILED DESCRIPTION

In overview, the present disclosure concerns a method of manufacturing a semiconductor component having at least two bipolar transistors with different design characteristics. More particularly, methodology makes use of the existing cavity oxide in a selective epitaxial silicon germanium bipolar complementary metal oxide semiconductor (SiGe BiCMOS) process as a mask to create two (or multiple) selective epitaxial base regions. The base cavity oxide layer is patterned using, for example, a photoresist to enable removal of the oxide layer in transistors in other regions of the die that do not have the mask layer. Further, methodology takes advantage of the selective nature of the SiGe epitaxial base growth. After the formation of a first selective epitaxial base region, an oxide deposition plus a second photoresist pattern is utilized to cover the first selective epitaxial base region while forming (i.e., growing) a second selective epitaxial base region at other regions of the die that do not have the oxide deposition plus a second photoresist pattern. The oxide deposition prevents growth of the selective epitaxial regions in undesired heterojunction bipolar transistor (HBT) regions. These mask layers also enable different collector doping profiles to be formed in each HBT region via implantation, thus creating multiple SiGe HBT's with multiple base and collector doping profiles on the same wafer or die.

The instant disclosure is provided to further explain in an enabling fashion the best modes, at the time of the application, of making and using various embodiments in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It should be understood that the use of relational terms, if any, such as first and second, top and bottom, and the like are used solely to distinguish one from another entity or action without necessarily requiring or implying any actual such relationship or order between such entities or actions. Furthermore, some of the figures may be illustrated using various shading and/or hatching to distinguish the different elements. These different elements may be produced utilizing current and upcoming microfabrication techniques of depositing, patterning, etching, and so forth. Accordingly, although different shading and/or hatching is utilized in the illustrations, the different elements within the structural layers may be formed out of the same material.

Figure 1:
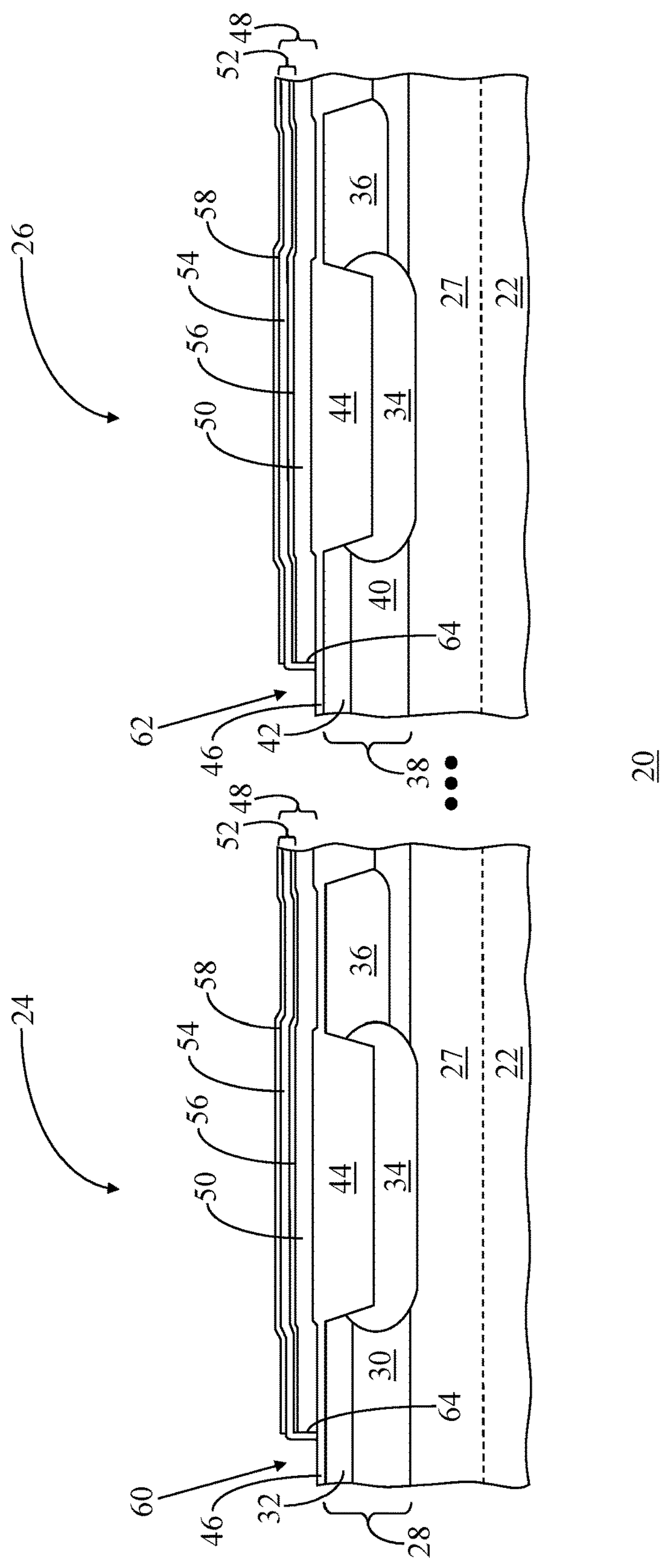
FIG. 1 shows a cross-sectional view of a portion of a semiconductor component following an initial stage of a manufacturing process in accordance with an embodiment.

Referring to FIG. 1, FIG. 1 shows a cross-sectional view of a portion of a semiconductor component 20 following an initial stage of a manufacturing process in accordance with an embodiment. For simplicity and clarity of illustration, the drawing figures, including FIGS. 1-16, illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements in the figures may be exaggerated relative to other elements to help improve understanding of embodiments of the present invention.

The portion of semiconductor component 20 includes a semiconductor substrate 22 having a first bipolar transistor 24 and a second bipolar transistor 26 partially formed therein. Only two bipolar transistors 24, 26 are shown in FIG. 1 for simplicity. Ellipses between first and second bipolar transistors 24, 26 generally denote that semiconductor component 20 can include any number of transistors. Further, semiconductor component 20 may represent a single semiconductor die or an entire wafer that includes a multiplicity of semiconductor dies.

In one embodiment, substrate 22 can comprise a p-type bulk silicon wafer or a n-type bulk silicon wafer. In a different embodiment, substrate 22 can comprise a different semiconductor material such as silicon-germanium, germanium, gallium arsenide, or the like. In another embodiment, substrate 22 can be a semiconductor-on-insulator (SOI) wafer having, for example, a first silicon layer, a second silicon layer, and an electrical insulator layer located between the first and second silicon layers.

In an embodiment, substrate 22 is a p-type substrate and includes a p-type epitaxial region 27. First transistor 24 includes a first substrate/collector structure 28 having a first collector region 30 underlying a first silicon region 32, a heavily doped n-type region 34, and an n-type buried resistor 36. Similarly, second transistor 26 includes a second substrate/collector structure 38 having a second collector region 40 underlying a second silicon region 42, heavily doped n-type region 34, and n-type buried resistor 36. The methods of forming regions 30, 32, 34, 36, 40, and 42 are well-known in the art and will not be depicted herein.

For first bipolar transistor 24, an isolation structure 44 may be formed over a portion of region 34 and a dielectric layer 46 may be formed over first silicon region 32, isolation structure 44, and n-type buried resistor 36. Likewise, for second bipolar transistor 26, isolation structure 44 may be formed over a portion of region 34 and dielectric layer 46 may be formed over second silicon region 42, isolation structure 44, and n-type buried resistor 36. Dielectric layer 46 is an electrically insulating layer and can be formed by growing a thermal oxide, by depositing an oxide such as silicon oxy-nitride, by using TEOS (tertraethylorthosilicate) to form an oxide, or by growing and/or depositing a combination dielectric comprised of any of the previously listed materials. Hence, layer 46 may be referred to herein as first oxide layer 46.

With continued reference to FIG. 1, a base electrode stack 48 is formed over first oxide layer 46 of each of first and second bipolar transistors 24, 26. Base electrode stack 48 may include a base polysilicon electrode layer 50 and an oxide nitride structure 52 formed over base polysilicon electrode 50. In an example, base polysilicon electrode layer 50 may be formed by depositing a layer of polysilicon over first oxide layer 46. Base polysilicon electrode layer 50 may be deposited by a LPCVD (low-pressure chemical vapor deposition) method. Layer 50 may be heavily p-type doped in-situ, by ion implantation, or by thermal diffusion. In-situ, as used herein, includes either doping using the same chamber or the same tool.

Oxide nitride structure 52 includes a nitride layer 54 sandwiched between two oxide layers 56, 58 to yield an oxide-nitride-oxide (ONO) structure. In an example, oxide layer 56 (such as TEOS) may be deposited on base polysilicon electrode layer 50. Thereafter, oxide layer 56 and base polysilicon electrode layer 50 may be suitably etched using one or more etch processes to form a first emitter window 60 over first substrate/collector structure 28 and a second emitter window 62 over second substrate/collector structure 38. However, first oxide layer 46 remains overlying each of first and second substrate/collector structures 28,38 in first and second emitter windows 60, 62.

Nitride layer 54, such as a silicon nitride ($Si_3N_4$) may be deposited over oxide layer 56 and over first and second emitter windows 60, 62, and oxide layer 58 may be suitably formed over nitride layer 54. In some processes, nitride layer 54 may additionally cover sidewalls 64 of base polysilicon layer 50 and oxide layer 56 of base electrode stack 48 in each of first and second emitter windows 60, 62 without covering first oxide layer 46 in first and second emitter windows 60, 62. Alternatively, a separate nitride spacer may be formed on sidewalls 64 of base polysilicon layer 50 and oxide layer 56. In either instance, the nitride on sidewalls 64 prevents selective epitaxial growth on sidewalls 64 in a later manufacturing step. The methods of forming polysilicon electrode layer 50, oxide nitride structure 52, and a nitride layer covering sidewalls 64 of base polysilicon layer 50 and oxide layer 56 of base electrode stack 48 in each of first and second emitter windows 60, 62 are well-known in the art and will not be depicted herein.

Accordingly, FIG. 1 depicts the provision of substrate 22 having first and second bipolar transistors 24, 26 formed therein, a base electrode stack 48 formed over each of first and second bipolar transistors 24, 26, a first emitter window 60 formed in base electrode stack 48 over first collector region 30 of first substrate/collector structure 28, and a second emitter window 62 formed in base electrode stack 48 over second collector region 42 of second substrate/collector structure 38. Further, FIG. 1 depicts, nitride layer 54 covering sidewall 64 of base electrode stack 48 in each of first and second emitter windows 60, 62 and first oxide layer 46 extending over first and second collector regions 30, 40 of respective first and second substrate/collector structures 28, 38 in respective first and second emitter windows 60, 62. Following provision of the structure shown in FIG. 1, methodology discussed below enables the formation of multiple SiGe HBT's within the same die or wafer with different base and collector doping profiles.

Figure 2:
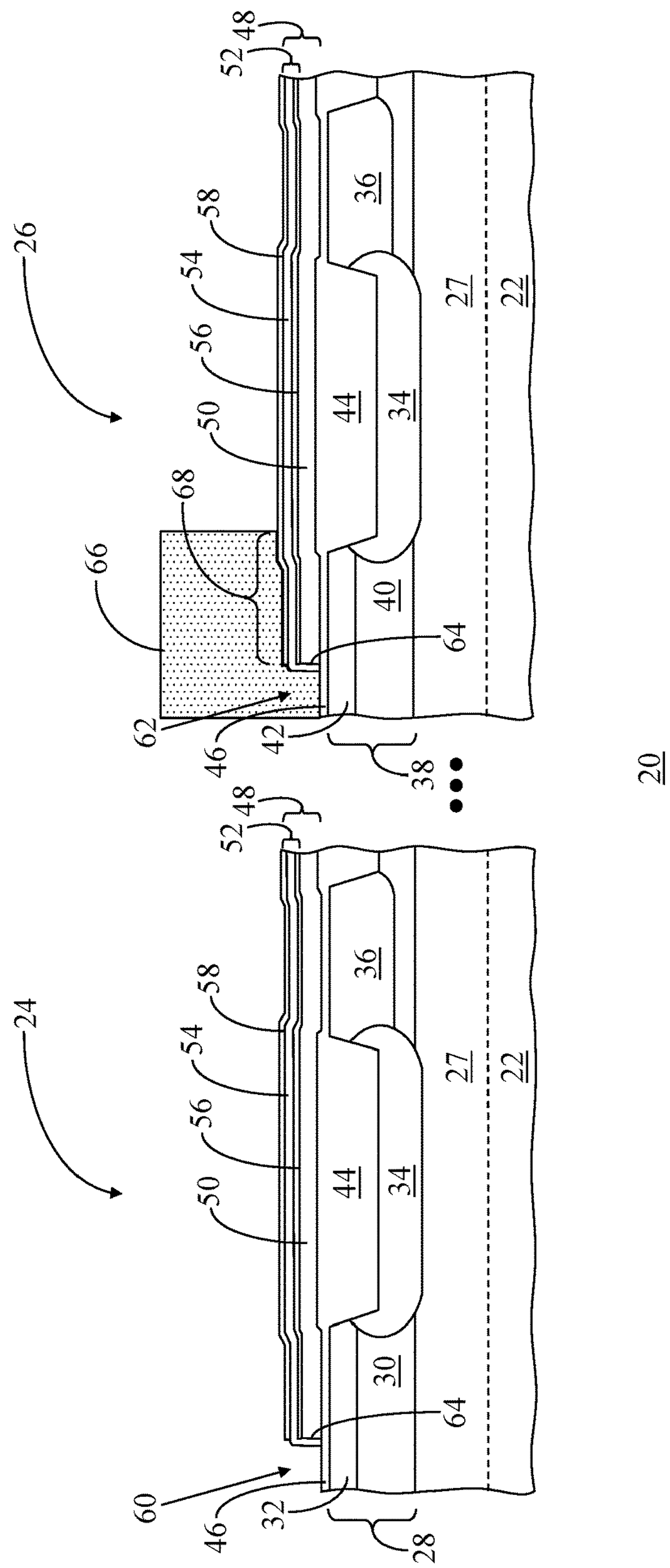
FIG. 2 shows a cross-sectional view of the portion of the semiconductor component of FIG. 1 following a subsequent stage of the manufacturing process.

FIG. 2 shows a cross-sectional view of the portion of semiconductor component 20 of FIG. 1 following a subsequent stage of the manufacturing process. After provision of the structure of FIG. 1, a first mask layer 66 is formed over first oxide layer 46 in second emitter window 62. First mask layer 66 may be a photoresist mask or a hard-etch mask. Additionally, first mask layer 66 may be formed over an emitter region 68 of base electrode stack 48, in which emitter region 68 is adjacent to second emitter window 62.

Figure 3:
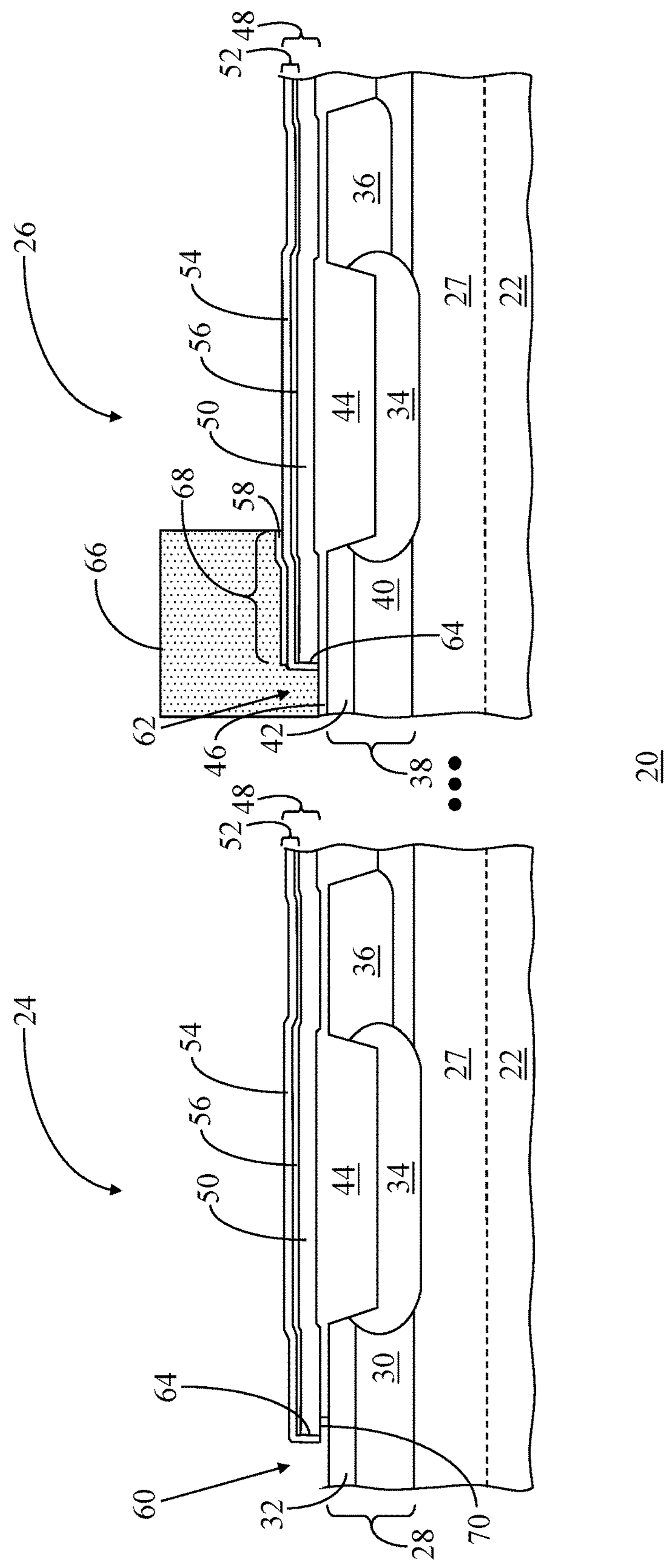
FIG. 3 shows a cross-sectional view of the portion of the semiconductor component of FIG. 2 following a subsequent stage of the manufacturing process.

FIG. 3 shows a cross-sectional view of the portion of semiconductor component 20 of FIG. 2 following a subsequent stage of the manufacturing process. After forming first mask layer 66, first oxide layer 46 is removed from first collector region 30 of first substrate/collector structure 28 in first emitter window 60. Additionally, oxide layer 58 at any un-masked regions of semiconductor component 20 may also concurrently be removed. First oxide layer 46 and oxide layer 58 at any un-masked regions of semiconductor component 20 may be removed using any suitable etch process. By way of example, a hydrofluoric acid (HF) oxide wet etch process may be performed. Within first emitter window 60, first oxide layer 46 is removed down to the surface of first silicon region 32. Additionally, a portion of first oxide layer 46 below nitride layer 54 on sidewall 64 is removed to expose an underside 70 of base polysilicon electrode layer 50.

Figure 4:
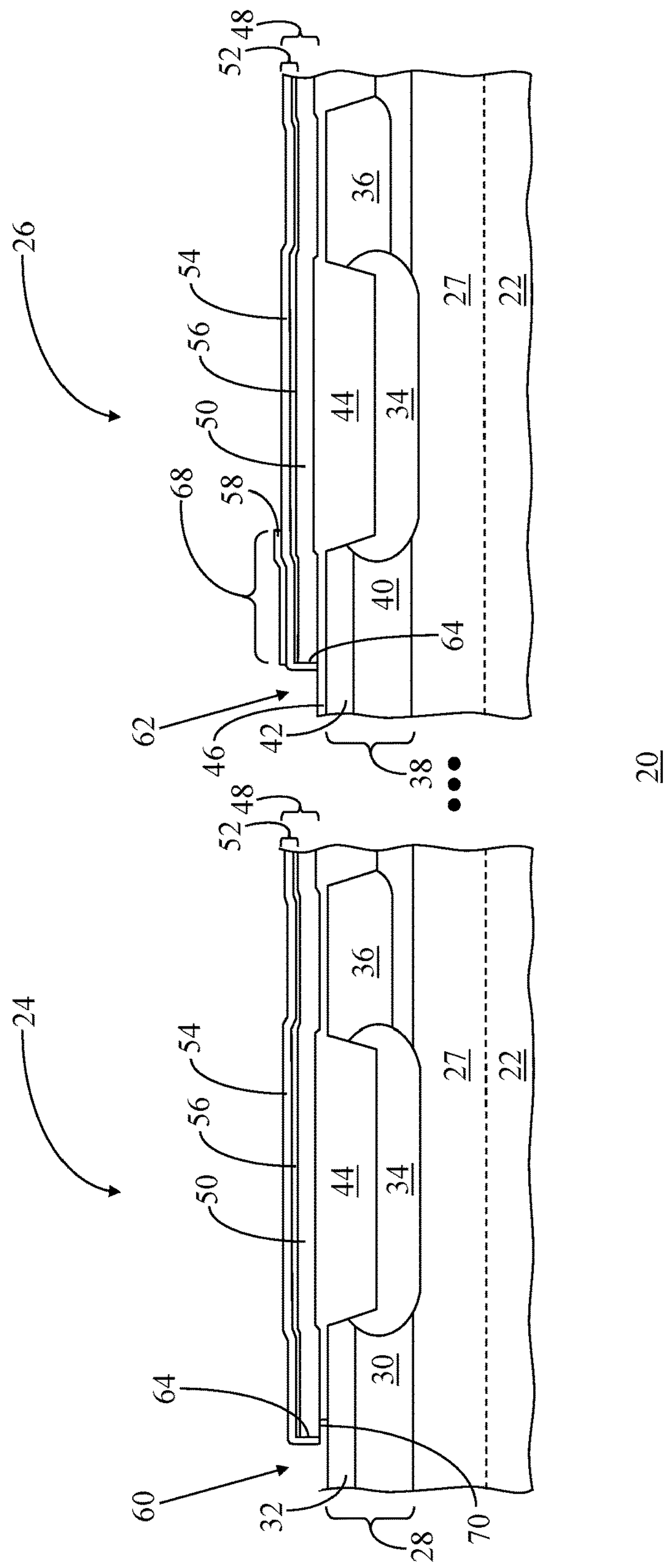
FIG. 4 shows a cross-sectional view of the portion of the semiconductor component of FIG. 3 following a subsequent stage of the manufacturing process.

FIG. 4 shows a cross-sectional view of the portion of the semiconductor component 20 of FIG. 3 following a subsequent stage of the manufacturing process. Following removal of first oxide layer 46 in first emitter window 60 and oxide layer 58 at any un-masked regions of semiconductor component 20, first mask layer 66 is removed from second emitter window 62 and emitter region 68. For example, first mask layer 66 may be removed by a photoresist strip process. The HF oxide wet etch followed by the photoresist strip process thus implements a typical dual gate oxide (DGO) cleaning process of oxide wet etch, resist strip, and a clean.

Figure 5:
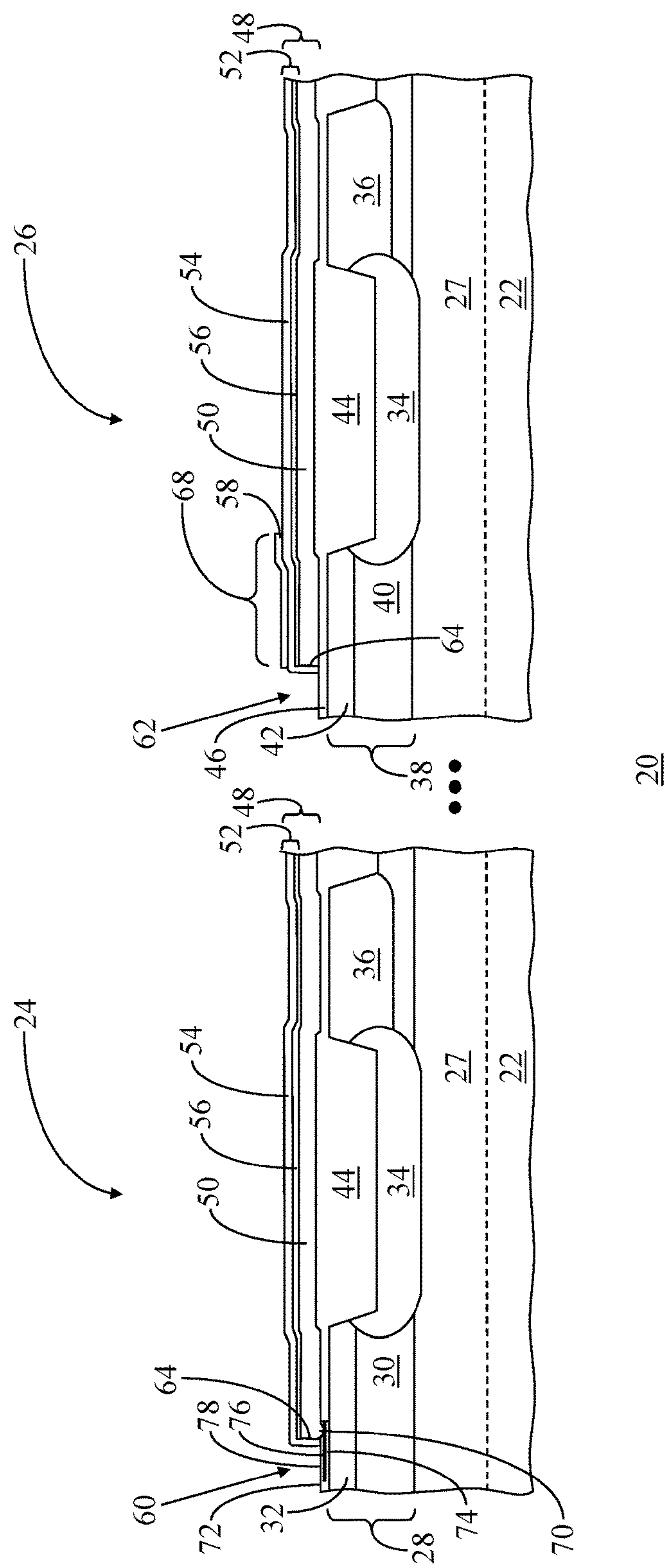
FIG. 5 shows a cross-sectional view of the portion of the semiconductor component of FIG. 4 following a subsequent stage of the manufacturing process.

FIG. 5 shows a cross-sectional view of the portion of the semiconductor component 20 of FIG. 4 following a subsequent stage of the manufacturing process. Following removal of first mask layer 66 (FIG. 3), a first epitaxial layer 72 for the base of first bipolar transistor 24 is formed in first emitter window 60. That is, selective growth of first epitaxial layer 72 is performed over first silicon region 32 of first substrate/collector structure 28 in first emitter window 60. Further, a portion of first epitaxial layer 72 is formed under the nitride spacer material on sidewalls 64 and in contact with underside 70 of base polysilicon electrode layer 50. Thus, first epitaxial layer 72 couples together base polysilicon electrode layer 50 and first substrate/collector structure 28.

However, the remaining first oxide layer 46 over second silicon region 42 of second substrate/collector structure 38 in second emitter window 62 prevents growth of first epitaxial layer 72 at second silicon region 42 of second substrate/collector structure 38 in second emitter window 62. Thus, first mask layer 66 (FIG. 3) in second emitter window 62 protects first oxide layer 46 in second emitter window 62 so as to prevent growth of first epitaxial layer 72 in second emitter window 62 during a later processing operation.

In one embodiment, first epitaxial layer 72 may be a composite epitaxial layer. As an example, first epitaxial layer 72 can formed by the process of growing a silicon epitaxial buffer layer 74 over first silicon region 32, growing a SiGeC (silicon-germanium-carbon) epitaxial layer 76 over silicon epitaxial buffer layer 74, and growing a silicon epitaxial cap layer 78 over SiGeC epitaxial layer 76. Only SiGeC epitaxial layer 76 may be doped or all three layers 74, 76, 78 can be doped. In other embodiments, first epitaxial layer 72 can be a composite epitaxial layer formed by a combination of silicon, silicon germanium (SiGe), SiGeC, or other crystalline semiconductor materials.

A selective epitaxial growth doping profile for the base of first bipolar transistor 24 may be suitably designed to meet specific criteria for a circuit that contains first bipolar transistor 24. That is, silicon epitaxial buffer layer 74, SiGeC epitaxial layer 76, and/or silicon epitaxial cap layer 78 may be configured to meet particular design characteristics. Additionally, or alternatively, a selectively implanted collector (SIC) implant may be performed in first silicon region 32. SIC implantation will be discussed in connection with FIGS. 8, 15, and 16 below. In an example, when the design characteristics for first bipolar transistor 24 are to be a high breakdown voltage (BV) and low bipolar transistor collector-base junction capacitance (CJC), then silicon epitaxial buffer layer 74 may be formed relatively thick with no SIC implant. In another example, when the design characteristics for first bipolar transistor 24 are to be low flicker (1/f) noise and low bipolar transistor emitter-base junction capacitance (CJE), then silicon epitaxial cap layer 78 may be formed relatively thick for low base current, and so forth. In yet another example, when the design characteristics for first bipolar transistor 24 are to be low bipolar transistor base resistance (RB), then SiGeC epitaxial layer 76 may be highly doped. The above scenarios are provided as examples. Those skilled in the art will recognize that other design characteristics for first epitaxial layer 72 of first bipolar transistor 24 (with or without SIC implantation) may alternatively be implemented. However, the presence of first oxide layer 46 over second silicon region 42 of second substrate/collector structure 38 in second emitter window 62 prevents growth of first epitaxial layer 72, with its particular design characteristics, in association with second bipolar transistor 26.

Figure 6:
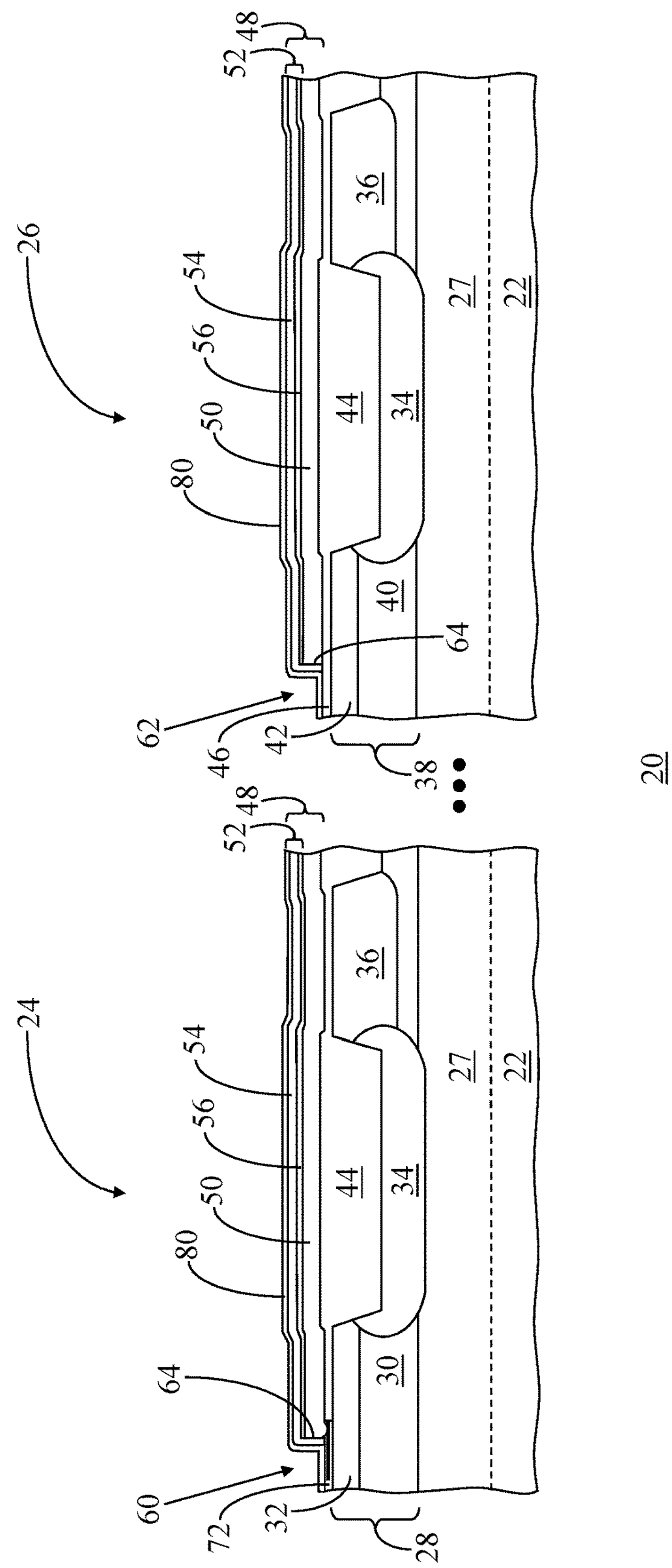
FIG. 6 shows a cross-sectional view of the portion of the semiconductor component of FIG. 5 following a subsequent stage of the manufacturing process.

FIG. 6 shows a cross-sectional view of the portion of semiconductor component 20 of FIG. 5 following a subsequent stage of the manufacturing process. Following formation of first epitaxial layer 72, a second oxide layer 80 is formed over first epitaxial layer 72 in first emitter window 60. More particularly, second oxide layer 80 may be formed over the entire surface of semiconductor component 20. Thus, second oxide layer 80 may be formed over base electrode stack 48 and over first oxide layer 46 in second emitter window 62 concurrently with forming second oxide layer 80 over first epitaxial layer 72. By way of example, second oxide layer 80 may be formed by depositing an oxide such as TEOS or silicon oxy-nitride, by growing a thermal oxide, or by any other suitable process. Second oxide layer 80 is formed to a thickness sufficient to protect first epitaxial layer 72 within first emitter window 60.

Figure 7:
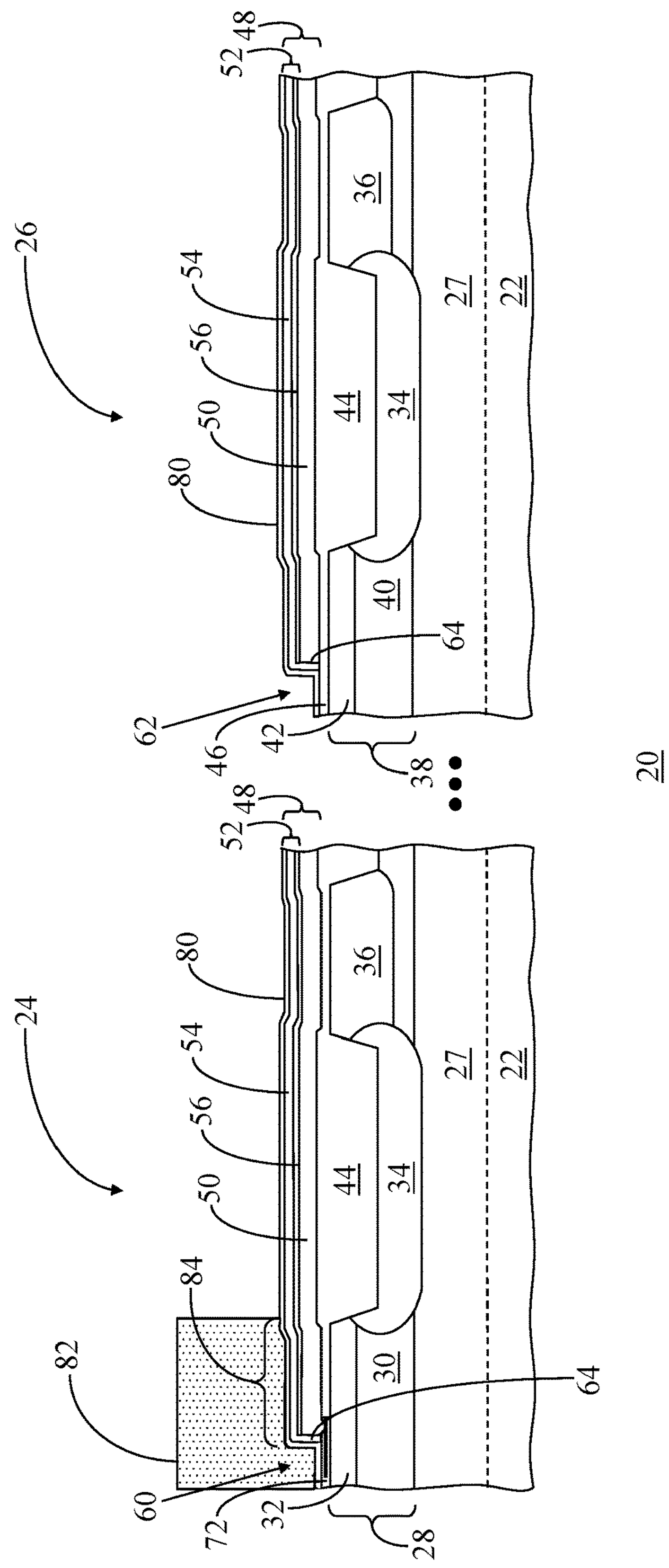
FIG. 7 shows a cross-sectional view of the portion of the semiconductor component of FIG. 6 following a subsequent stage of the manufacturing process.

FIG. 7 shows a cross-sectional view of the portion of semiconductor component 20 of FIG. 6 following a subsequent stage of the manufacturing process. Following formation of second oxide layer 80, a second mask layer 82 is formed over second oxide layer 80 in first emitter window 60. Second mask layer 82 may be a photoresist mask or a hard-etch mask. Additionally, second mask layer 82 may be formed over an emitter region 84 of base electrode stack 48, in which emitter region 84 is adjacent to first emitter window 60.

Figure 8:
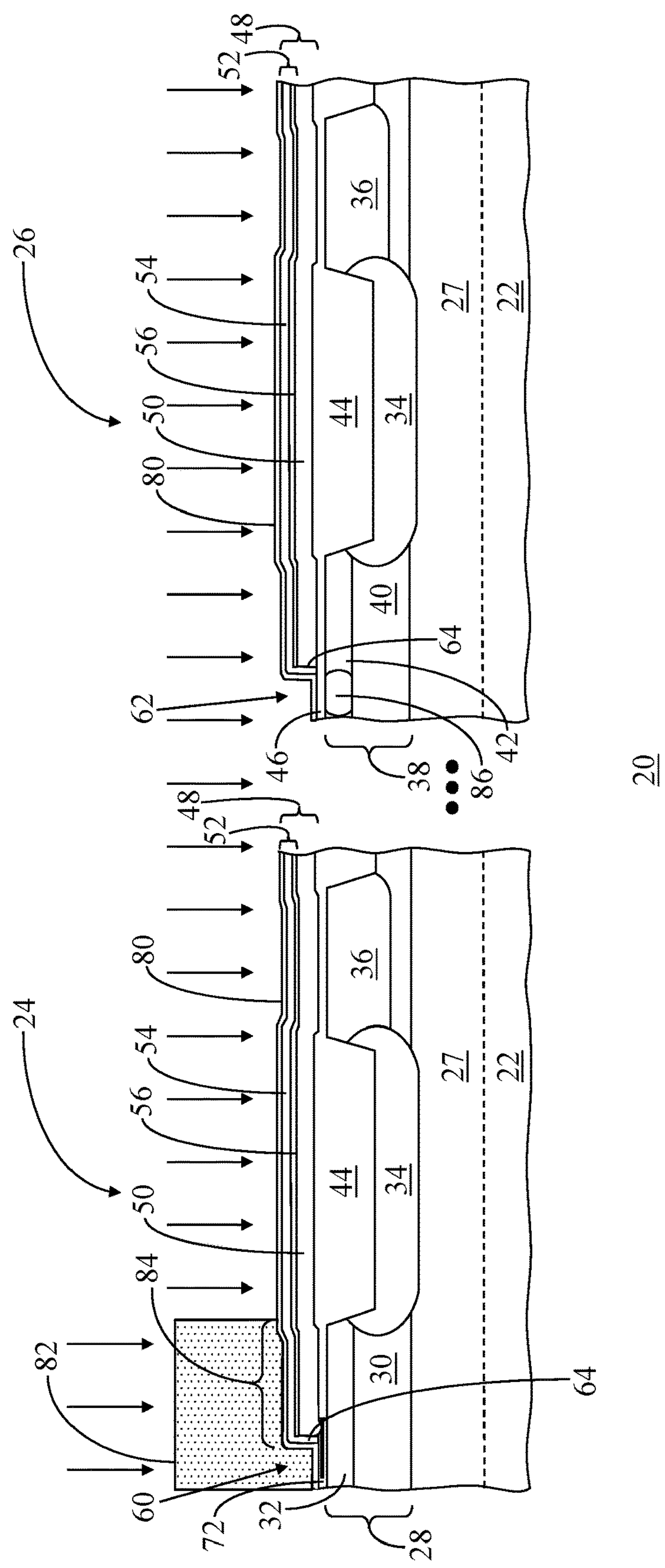
FIG. 8 shows a cross-sectional view of the portion of the semiconductor component of FIG. 7 following a subsequent stage of the manufacturing process.

FIG. 8 shows a cross-sectional view of the portion of semiconductor component 20 of FIG. 7 following a subsequent stage of the manufacturing process. As particularly shown in FIG. 8, a SIC implant process may be performed in second silicon region 42 to form a SIC doped region 86 implanted in second silicon region 42. A dedicated selectively implanted collector (SIC) may be implanted when, for example, a high doping profile is necessary for a high unity current gain frequency (fT) device. Second mask layer 82 prevents formation of a SIC region in first emitter window 60. Thus, a different selectively implanted collector (SIC) implant for each of first and second bipolar transistors 24, 26 may be facilitated by the described methodology. Following SIC implantation, an anneal process may be performed to anneal any crystal damage. In an example, a fast ramp, short time "spike" anneal process may be performed to minimize diffusion of the base profile for first bipolar transistor 24.

Figure 9:
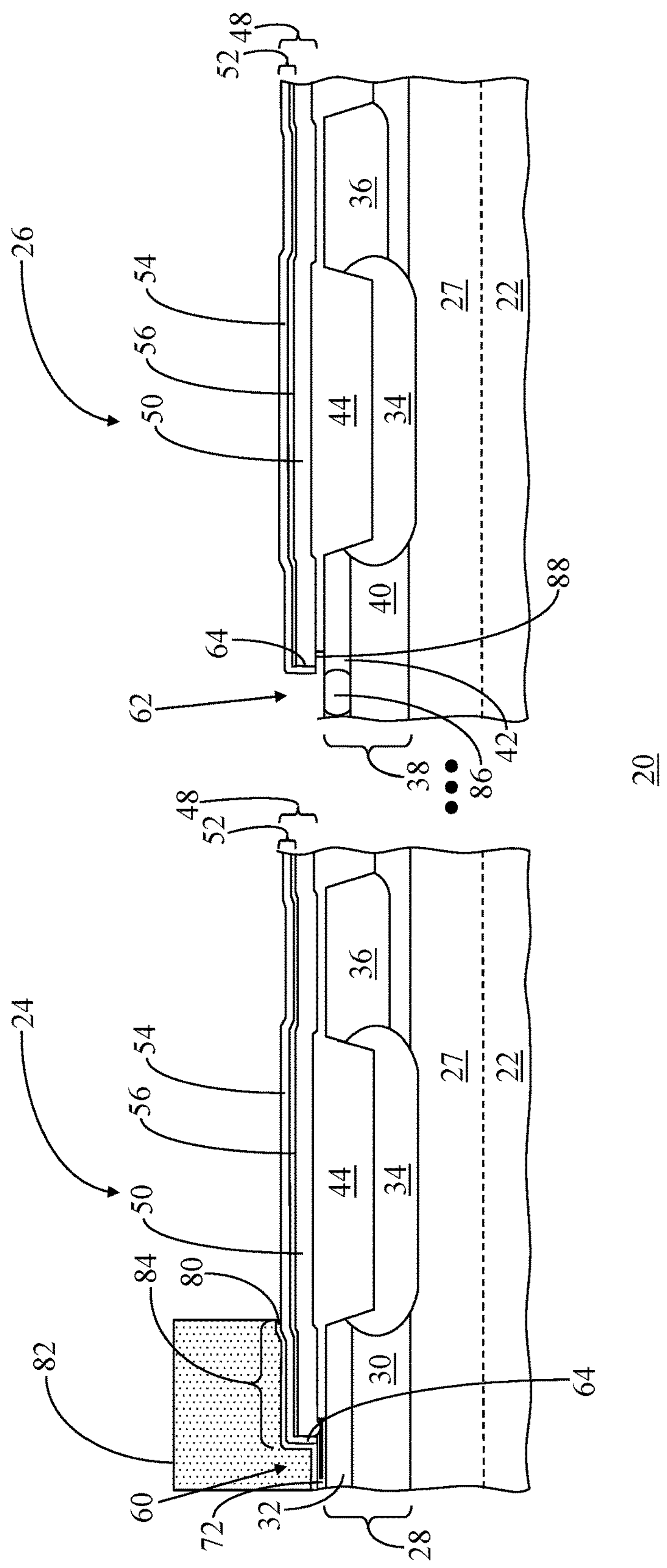
FIG. 9 shows a cross-sectional view of the portion of the semiconductor component of FIG. 8 following a subsequent stage of the manufacturing process.

FIG. 9 shows a cross-sectional view of the portion of semiconductor component 20 of FIG. 8 following a subsequent stage of the manufacturing process. After forming second mask layer 82, first oxide layer 46 and second oxide layer 80 are removed from second collector region 40 of second substrate/collector structure 38 in second emitter window 62. Additionally, second oxide layer 80 at any un-masked regions of semiconductor component 20 may also concurrently be removed. First oxide layer 46 in second emitter window 62 and second oxide layer 80 at any un-masked regions of semiconductor component 20 may be removed using any suitable etch process. By way of example, a hydrofluoric acid (HF) oxide wet etch process may be performed. Within second emitter window 62, first and second oxide layers 46, 80 are removed down to the surface of second silicon region 42. Further, a portion of first oxide layer 46 is removed below nitride layer 54 on sidewall 64 to expose an underside 88 of base polysilicon electrode layer 50 at second emitter window 62.

Figure 10:
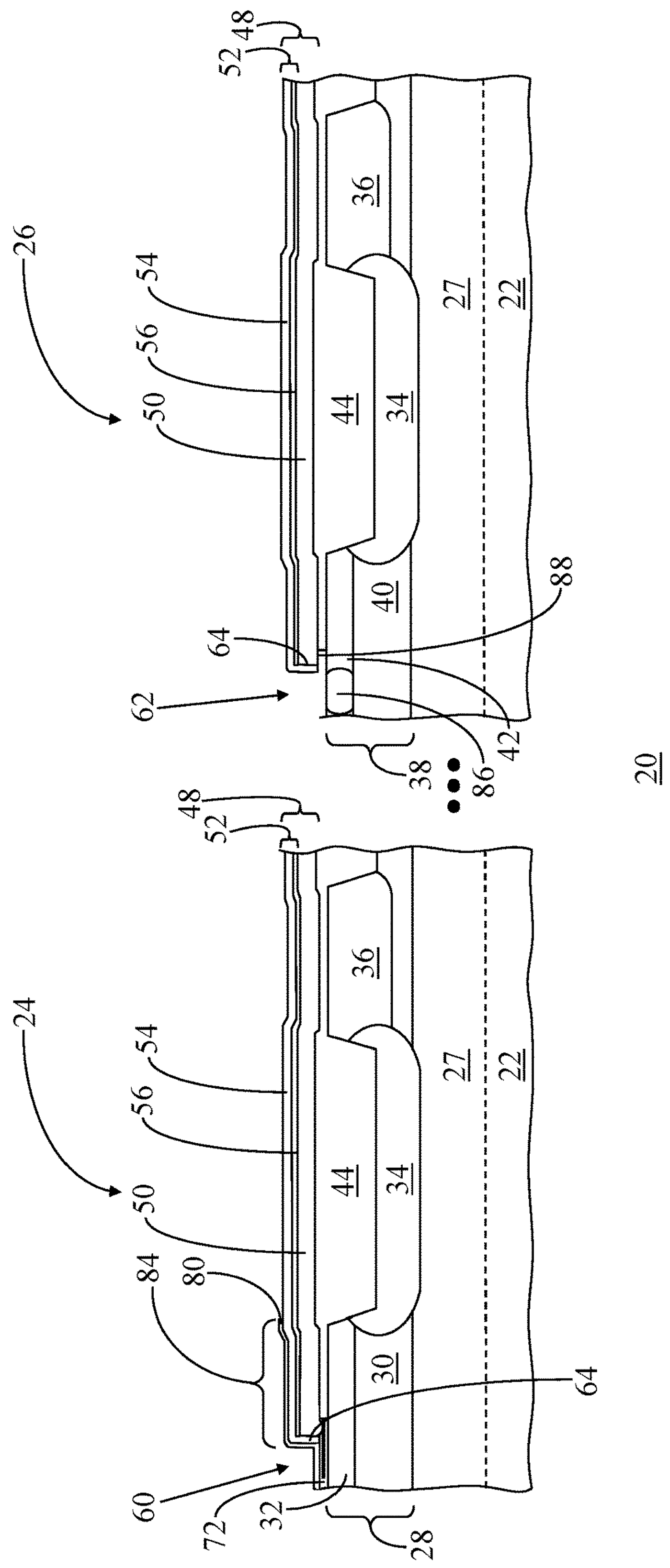
FIG. 10 shows a cross-sectional view of the portion of the semiconductor component of FIG. 9 following a subsequent stage of the manufacturing process.

FIG. 10 shows a cross-sectional view of the portion of semiconductor component 20 of FIG. 9 following a subsequent stage of the manufacturing process. Following removal of first and second oxide layers 46, 80 at any un-masked regions of semiconductor component 20, second mask layer 82 (FIG. 9) is removed from first emitter window 60 and emitter region 84. For example, second mask layer 82 may be removed by a photoresist strip process. The HF oxide wet etch followed by the photoresist strip process again implements the typical dual gate oxide (DGO) cleaning process of oxide wet etch, resist strip, and a clean.

Figure 11:
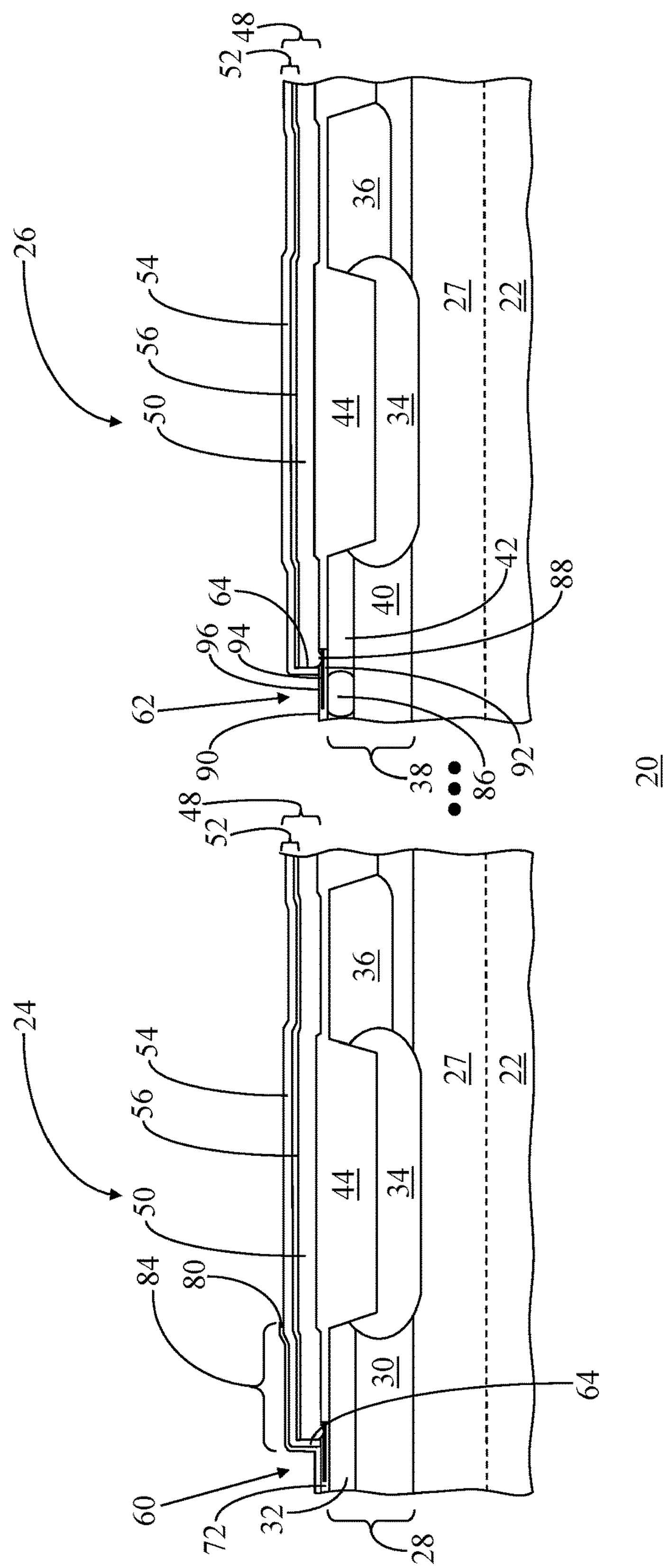
FIG. 11 shows a cross-sectional view of the portion of the semiconductor component of FIG. 10 following a subsequent stage of the manufacturing process.

FIG. 11 shows a cross-sectional view of the portion of semiconductor component 20 of FIG. 10 following a subsequent stage of the manufacturing process. Following removal of second mask layer 82, a second epitaxial layer 90 for the base of second bipolar transistor 26 is formed in second emitter window 62. That is, selective growth of second epitaxial layer 90 is performed over second silicon region 42 of second substrate/collector structure 38 in second emitter window 60. Further, a portion of second epitaxial layer 90 is formed under the nitride spacer material on sidewalls 64 and in contact with underside 88 of base polysilicon electrode layer 50. Thus, second epitaxial layer 90 couples together base polysilicon electrode layer 50 and second substrate/collector structure 38.

However, second oxide layer 80 over first silicon region 32 of first substrate/collector structure 28 in first emitter window 60 prevents growth of second epitaxial layer 90 at first silicon region 32 of first substrate/collector structure 28. Thus, second mask layer 82 (FIG. 7) in first emitter window 60 protects second oxide layer 80 in first emitter window 60, which in turn prevents growth of second epitaxial layer 90 in first emitter window 60 during a later processing operation.

In one embodiment, second epitaxial layer 90 may be a composite epitaxial layer. As an example, second epitaxial layer 90 may be formed by the process of growing a silicon epitaxial buffer layer 92 over second silicon region 42, growing a SiGeC (silicon-germanium-carbon) epitaxial layer 94 over silicon epitaxial buffer layer 92, and growing a silicon epitaxial cap layer 96 over SiGeC epitaxial layer 94. Only SiGeC epitaxial layer 94 may be doped or all three layers 92, 94, 96 can be doped. In other embodiments, second epitaxial layer 90 can be a composite epitaxial layer formed by a combination of silicon, silicon germanium (SiGe), SiGeC, or other crystalline semiconductor materials.

As discussed in connection with first bipolar transistor 24 in FIG. 5, a selective epitaxial growth doping profile for the base of second bipolar transistor 26 may be suitably designed to meet specific criteria for a circuit that contains second bipolar transistor 26. That is, silicon epitaxial buffer layer 92, SiGeC epitaxial layer 94, and/or silicon epitaxial cap layer 96 may be configured to meet particular design characteristics. In this example that includes SIC doped region 86, the epitaxial doping/growth profile may be designed to meet specific criterial such as high unity current gain frequency (fT) and low bipolar transistor collector-base breakdown voltage (BVCBO) with a relatively thin silicon epitaxial cap layer 96 and a high percentage of germanium in SIC doped region 86. Of course, other design characteristics for second epitaxial layer 90 of second bipolar transistor 26 (with or without SIC implantation) may alternatively be implemented. However, the presence of second oxide layer 80 over first epitaxial layer 72 at first substrate/collector structure 28 in first emitter window 60 prevents growth of second epitaxial layer 90, with its particular design characteristics, in association with first bipolar transistor 24. Accordingly, first and second bipolar transistors 24, 26 may be formed with different collector doping profiles (e.g., SIC or no SIC, or higher/lower doping of SIC) and/or different epitaxial growth base profiles.

Figure 12:
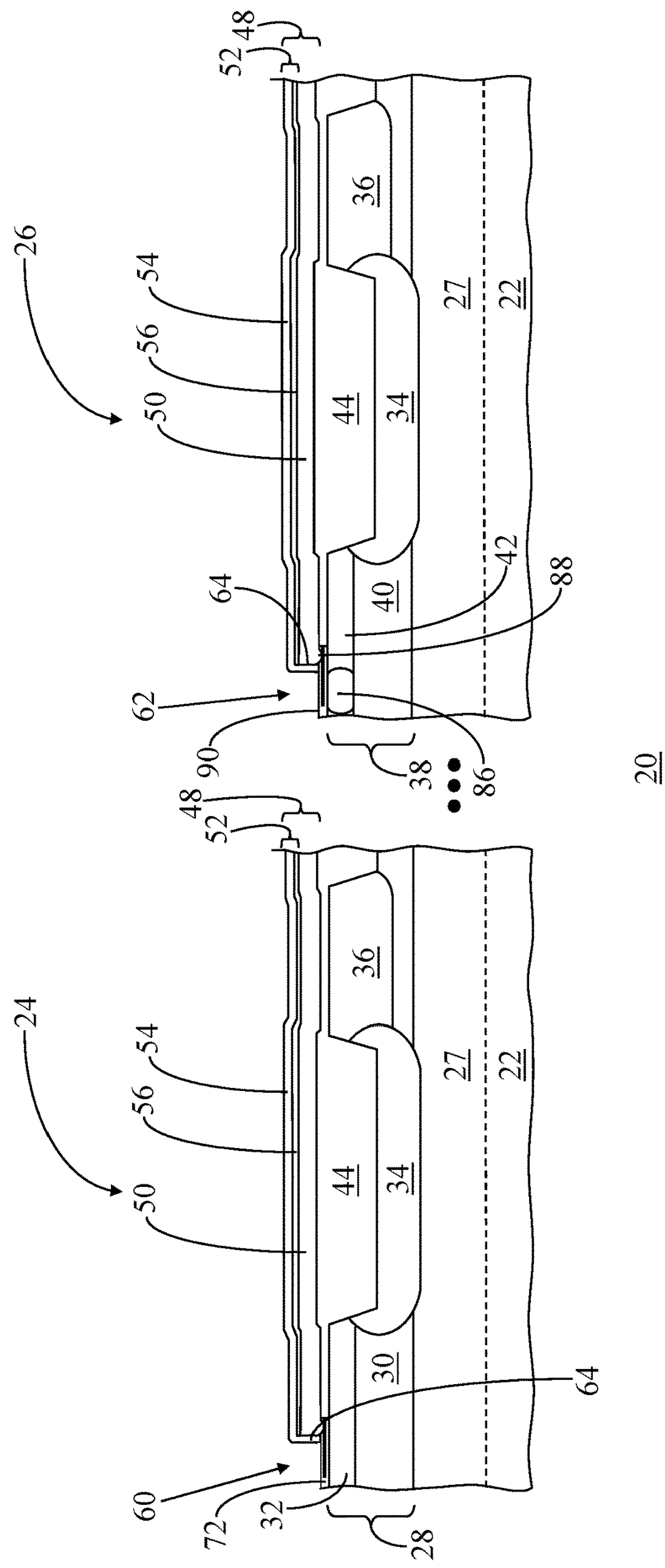
FIG. 12 shows a cross-sectional view of the portion of the semiconductor component of FIG. 11 following a subsequent stage of the manufacturing process.

FIG. 12 shows a cross-sectional view of the portion of semiconductor component 20 of FIG. 11 following a subsequent stage of the manufacturing process. Following formation of second epitaxial layer 90, second oxide layer 80 is removed from first epitaxial layer 72 in first emitter window 60. By way of example, a relatively short hydrofluoric acid (HF) oxide wet etch process may be performed to remove second oxide layer 80. Thus, first epitaxial layer 72 may only be exposed to minimal thermal treatment such as TEOS deposition (at approximately 600° C.), "spike" rapid thermal anneal, and pre-bake at approximately 850 C) of second epitaxial layer 90 to preclude diffusion of any dopants into first epitaxial layer 72 during subsequent processing operations.

Figure 13:
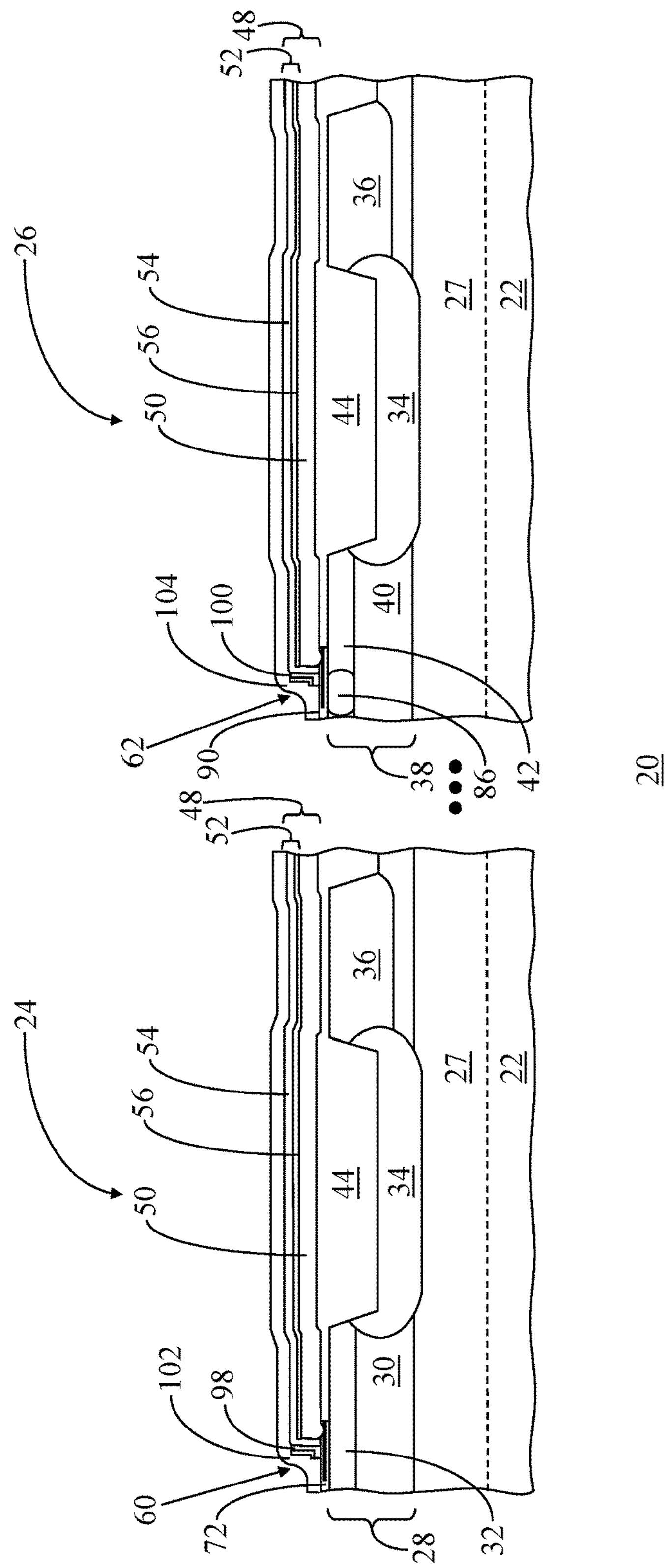
FIG. 13 shows a cross-sectional view of the portion of the semiconductor component of FIG. 12 following a subsequent stage of the manufacturing process.

FIG. 13 shows a cross-sectional view of the portion of semiconductor component 20 of FIG. 12 following a subsequent stage of the manufacturing process. Following formation of second epitaxial layer 90 and removal of second oxide layer 80 from first epitaxial layer 72, a conventional bipolar or BiCMOS process flow may commence. For example, emitter base spacers 98, 100 may be formed in accordance with known methodologies and emitter electrodes 102, 104 may be formed over semiconductor component 20 and in both of first and second emitter windows 60, 62. In an embodiment, emitter electrodes 102, 104 may be formed by depositing an in-situ doped polysilicon layer and then etching or patterning the layer. In another embodiment, emitter electrodes 102, 104 may be deposited and then doped with ion implantation.

Figure 14:
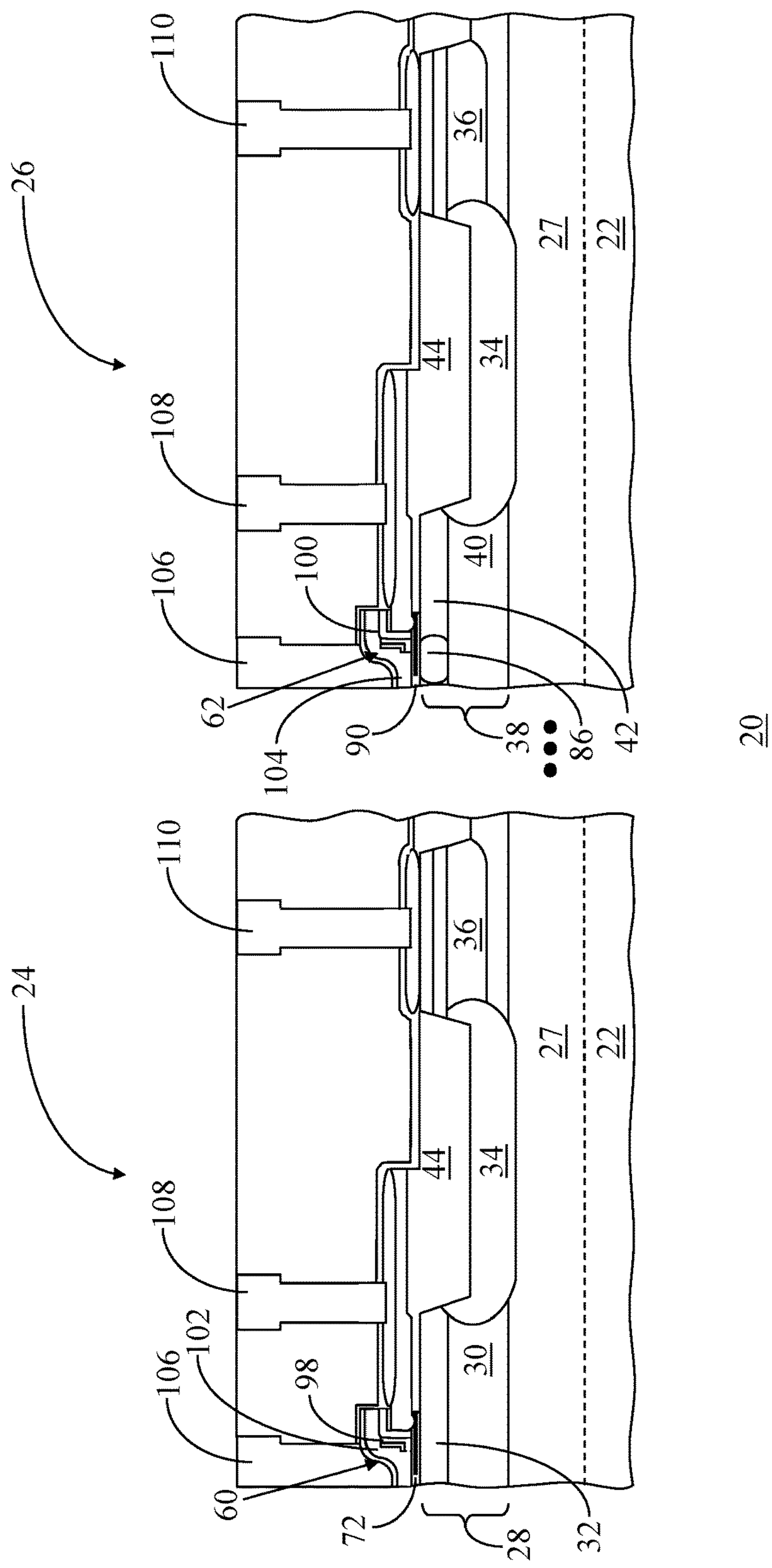
FIG. 14 shows a cross-sectional view of the portion of the semiconductor component of FIG. 13 following a subsequent stage of the manufacturing process.

FIG. 14 shows a cross-sectional view of the portion of semiconductor component 20 of FIG. 13 following a subsequent stage of the manufacturing process. Following formation of emitter electrodes 102, 104, subsequent processing operations may entail the formation of one or more metallization and passivation layers to produce, for example, emitter contacts 106, base contacts 108, collector contacts 110, and for forth. Thereafter, semiconductor component 20 may be diced or otherwise separated into individual dies or chips having two or more bipolar transistors 24, 26 with different design characteristics.

Figure 15:
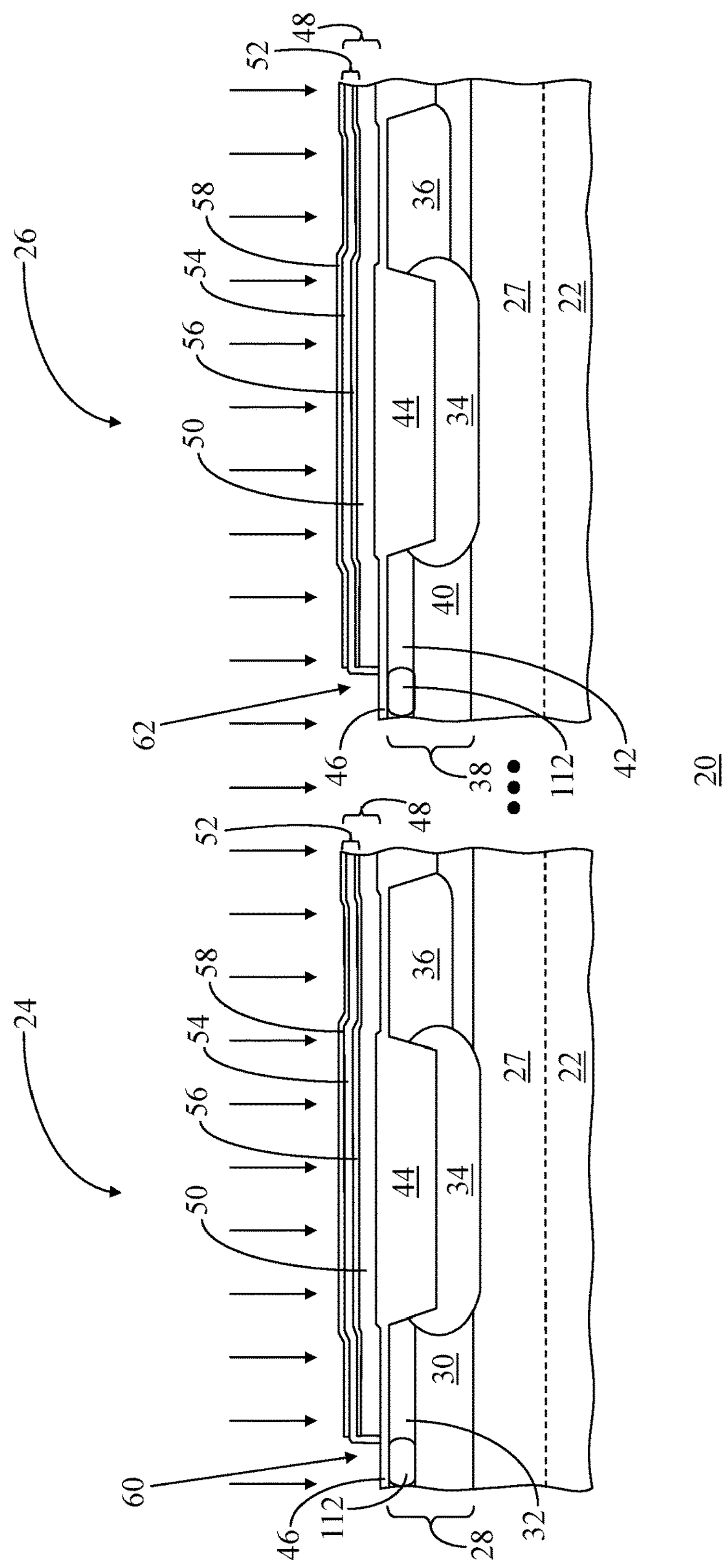
FIG. 15 shows a cross-sectional view of a portion of the semiconductor component in accordance with another embodiment.

FIG. 15 shows a cross-sectional view of a portion of semiconductor component 20 in accordance with another embodiment. FIG. 15 represents an optional condition in which semiconductor component 20 is initially provided with a blanket selectively implanted collector (SIC) doped region 112 implanted in both of first and second silicon regions 32, 42 of first and second bipolar transistors 24, 26. Thereafter, continued processing demonstrated in FIGS. 2-14 may be performed.

Figure 16:
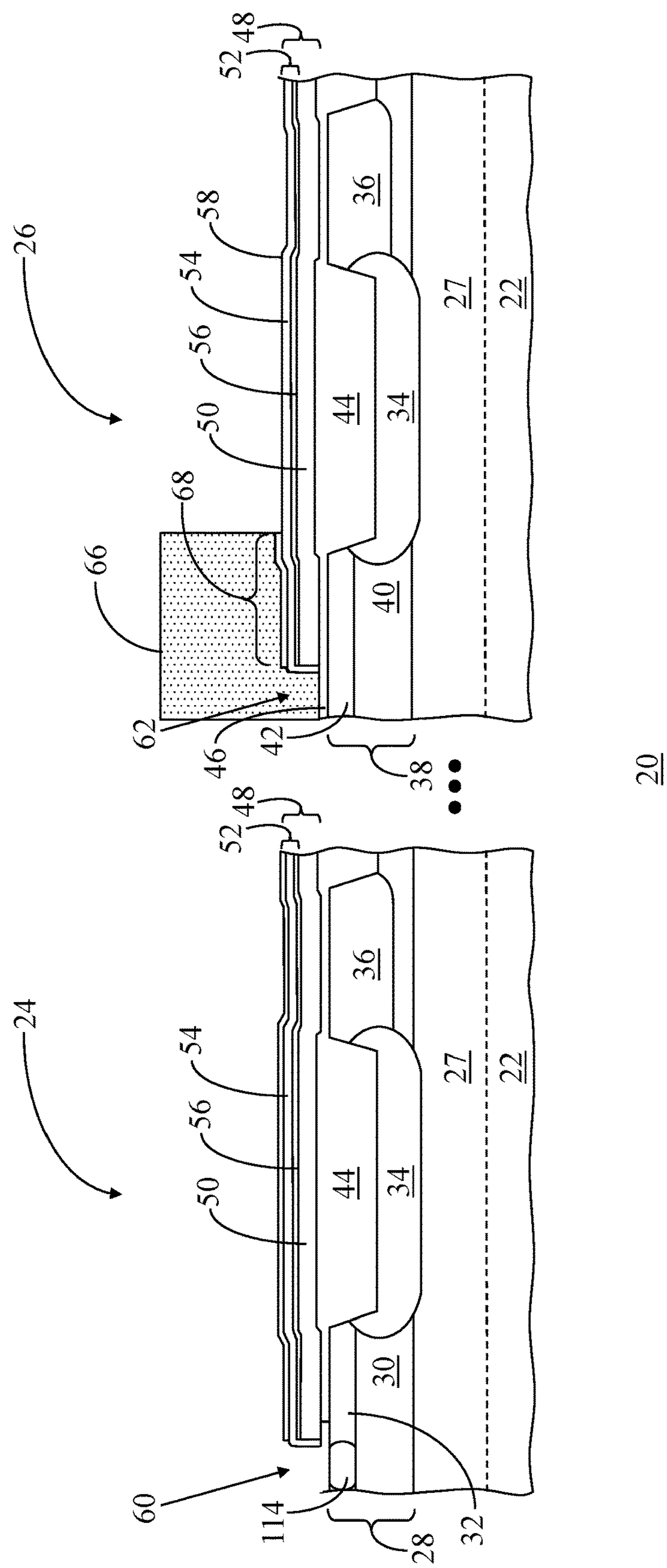
FIG. 16 shows a cross-sectional view of a portion of the semiconductor component in accordance with another embodiment.

FIG. 16 shows a cross-sectional view of the portion of semiconductor component 20 in accordance with another embodiment. FIG. 16 represents a condition in which a SIC doped region 114 is formed in first silicon region 32 of first bipolar transistor 24, but not in second silicon region 42 of second bipolar transistor 26 due to the presences of second mask layer 82. Thereafter, continued processing demonstrated in FIGS. 2-14 may be performed.

FIG. 17 shows a flowchart for a method 116 of manufacturing a semiconductor component in accordance with an embodiment. Method 116 forms a semiconductor component having two or more bipolar transistors with different design characteristics. For example, the two or more bipolar transistors may have different collector doping profiles and/or different epitaxial growth base profiles. Thus, method 116 summarizes the processing operations illustrated in FIGS. 1-16.

Method 116 begins at a block 118 at which a substrate is provided with two or more partially formed bipolar transistors, such as semiconductor component 20 shown in FIG. 2. At a block 120, a mask layer (e.g., a photomask) is formed in one or more selected emitter windows. As an example, first mask layer 66 may be formed in second emitter window 62 of second bipolar transistor 26 (see FIG. 2). At an optional block 122, a selectively implanted collector (SIC) doped region may be formed in one or more un-masked emitter windows incorporating a selected doping profile. As an example, SIC doped region 114 may be formed in first silicon region 32 of first substrate/collector structure 28 in the un-masked first emitter window 60 of first bipolar transistor 24 (see FIG. 16).

Method 116 continues at a block 124 at which the oxide layer is removed in the one or more un-masked emitter windows. Again, by way of example, first oxide layer 46 may be removed from first silicon region 32 of first substrate/collector structure 28 in first emitter window 60 (see FIG. 3). At a block 126, the mask layer may be removed. For example, first mask layer 66 may be removed from second emitter window 52 of semiconductor component 20 (see FIG. 4). Next, at a block 128, an epitaxial layer with a selected epitaxial growth profile is formed in the one or more emitter windows in which the oxide layer was removed at block 124. In an example, first epitaxial layer 72 is formed at first silicon region 32 of first substrate/collector structure 28 in first emitter window 60 (see FIG. 5).

Method 116 continues at a query block 130. At query block 130, a determination is made as to whether the methodology is to be repeated for other emitter windows. When method 116 is to be continued for other emitter windows, a block 132 is performed. At block 132, an oxide layer is formed over the epitaxial layer. For example, second oxide layer 80 is formed over first epitaxial layer 72 of first bipolar transistor 24 (see FIG. 6). Thereafter, blocks 120, 122, 124, 126, 128 are repeated for another bipolar transistor. In an example, second mask layer 82 is formed in first emitter window 60 of first bipolar transistor 24 (see FIG. 7) at block 120. SIC doped region 86 may optionally be formed in second emitter window 62 incorporating a selected doping profile (see FIG. 8) at block 122. First oxide layer 46 in second emitter window 62 of second bipolar transistor 26 may be removed (see FIG. 9) at block 124. Second mask layer 82 may be removed from first emitter window 60 of first bipolar transistor 24 (see FIG. 10) at block 126. Second epitaxial layer 90 with a selected epitaxial growth profile may be formed in second emitter window 62 (see FIG. 11) at block 128, and thereafter process control returns to query block 130. Thus, various bipolar transistors having differing design characteristics such as different collector doping profiles and/or different epitaxial growth base profiles may be manufactured.

When a determination is made at query block 130 that the methodology is not to be repeated for other emitter windows, a block 134 is performed. At block 134, the oxide layer is removed from the epitaxial layer. In an example, second oxide layer 80 is removed from first epitaxial layer 72 in first emitter window 60 of first bipolar transistor (see FIG. 12). Thereafter, at a block 136 continued processing is performed such as forming emitter base spacers, 98, 100, emitter electrodes 102, 104, emitter contacts 106, base contacts 108, collector contacts 110, and so forth (see FIGS. 13-14).

Embodiments described here entail methodology for manufacturing a semiconductor component having at least two bipolar transistors having different characteristics. An embodiment of a method of manufacturing a semiconductor component comprises providing a substrate having first and second bipolar transistors partially formed therein, a base electrode stack formed over each of the first and second bipolar transistors, a first emitter window formed in the base electrode stack over a first collector region of the first bipolar transistor, and a second emitter window formed in the base electrode stack over a second collector region of the second bipolar transistor, wherein a nitride layer covers a sidewall of the base electrode stack in each of the first and second emitter windows and a first oxide layer extends over the first and second collector regions. The method further comprises forming a first mask layer over the first oxide layer in the second emitter window, removing the first oxide layer from the first collector region in the first emitter window, forming a first epitaxial layer in the first emitter window following removal of the first oxide layer from the first collector region, wherein the first mask layer protects the first oxide layer in the second emitter window to prevent growth of the first epitaxial layer in the second emitter window, forming a second oxide layer over the first epitaxial layer in the first emitter window, forming a second mask layer over the second oxide layer and the first epitaxial layer in the first emitter window, removing the first oxide layer from the second collector region in the second emitter window, and forming a second epitaxial layer in the second emitter window following removal of the first oxide layer from the second collector region, wherein the second oxide layer in the first emitter window prevents growth of the second epitaxial layer in the first emitter window.

Another embodiment of method of manufacturing a semiconductor component comprises providing a substrate having first and second bipolar transistors partially formed therein, a base electrode stack formed over each of the first and second bipolar transistors, a first emitter window formed in the base electrode stack over a first collector region of the first bipolar transistor, and a second emitter window formed in the base electrode stack over a second collector region of the second bipolar transistor, wherein a nitride layer covers a sidewall of the base electrode stack in each of the first and second emitter windows and a first oxide layer extends over the first and second collector regions. The method further comprises forming a first mask layer over the first oxide layer in the second emitter window, removing the first oxide layer from the first collector region in the first emitter window, removing the first mask layer from the second emitter window following removing the first oxide layer from the first collector region, forming a first epitaxial layer in the first emitter window following removal of the first oxide layer from the first collector region, wherein the first oxide layer in the second emitter window prevents growth of the first epitaxial layer in the second emitter window, forming a second oxide layer over the first epitaxial layer in the first emitter window, forming a second mask layer over the second oxide layer and the first epitaxial layer in the first emitter window, removing the first oxide layer from the second collector region in the second emitter window, removing the second mask layer in the first emitter window following removal of the first oxide layer from the second collector region in the second emitter window, forming a second epitaxial layer in the second emitter window following removal of the first oxide layer from the second collector region, wherein the second oxide layer over the first collector region in the first emitter window prevents growth of the second epitaxial layer in the first emitter window, and removing the second oxide layer from the first epitaxial layer in the first emitter window following formation of the second epitaxial layer.

Thus, methodology described herein makes use of an existing cavity oxide in a selective epitaxial silicon germanium bipolar complementary metal oxide semiconductor (SiGe BiCMOS) process as a mask to create two (or multiple) selective epitaxial base regions. The base cavity oxide layer is patterned using, for example, a photoresist to enable removal of the oxide layer in transistors in other regions of the die that do not have the mask layer. Further, methodology takes advantage of the selective nature of the SiGe epitaxial base growth. After the formation of a first selective epitaxial base region, an oxide deposition plus a second photoresist pattern is utilized to cover the first selective epitaxial base region while forming (i.e., growing) a second selective epitaxial base region at other regions of the die that do not have the oxide deposition plus a second photoresist pattern. The oxide deposition prevents growth of the selective epitaxial regions in undesired heterojunction bipolar transistor (HBT) regions. These mask layers also enable different collector doping profiles to be formed in each HBT region via implantation, thus creating multiple SiGe HBT's with multiple base and collector doping profiles on the same wafer or die.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A method of manufacturing a semiconductor component comprises:

providing a substrate having first and second bipolar transistors partially formed therein, a base electrode stack formed over each of the first and second bipolar transistors, a first emitter window formed in the base electrode stack over a first collector region of the first bipolar transistor, and a second emitter window formed in the base electrode stack over a second collector region of the second bipolar transistor, wherein a nitride layer covers a sidewall of the base electrode stack in each of the first and second emitter windows and a first oxide layer extends over the first and second collector regions;

forming a first mask layer over the first oxide layer in the second emitter window;

removing the first oxide layer from the first collector region in the first emitter window;

forming a first epitaxial layer in the first emitter window following removal of the first oxide layer from the first collector region, wherein the first mask layer protects the first oxide layer in the second emitter window to prevent growth of the first epitaxial layer in the second emitter window;

forming a second oxide layer over the first epitaxial layer in the first emitter window;

forming a second mask layer over the second oxide layer and the first epitaxial layer in the first emitter window;

removing the first oxide layer from the second collector region in the second emitter window; and forming a second epitaxial layer in the second emitter window following removal of the first oxide layer from the second collector region, wherein the second oxide layer in the first emitter window prevents growth of the second epitaxial layer in the first emitter window.

2. The method of claim 1 wherein:

removing the first oxide layer from the first collector region comprises removing a portion of the first oxide layer below the nitride layer to expose the base electrode stack; and forming the first epitaxial layer comprises forming the first epitaxial layer with a portion of the first epitaxial layer underneath the nitride layer and in contact with the base electrode stack.

3. The method of claim 1 further comprising removing the first mask layer from the second emitter window following removal of the first oxide layer from the first collector region and prior to forming the first epitaxial layer, wherein the first oxide layer in the second collector region prevents growth of the first epitaxial layer in the second emitter window.

4. The method of claim 1 wherein a first silicon region extends over the first collector region in the first emitter window, a second silicon region extends over the second collector region in the second emitter window, and the method further comprises forming a selectively implanted collector in the first silicon region above the first collector region, wherein the first mask layer prevents formation of the selectively implanted collector in the second silicon region above the second collector region.

5. The method of claim 1 wherein forming the second oxide layer comprises forming the second oxide layer over the base electrode stack and the second emitter window concurrently with forming the second oxide layer over the first epitaxial layer.

6. The method of claim 5 wherein removing the first oxide layer from the second collector region in the second emitter window comprises removing both of the first and second oxide layers from the second collector region in the second emitter window.

7. The method of claim 1 wherein:

removing the first oxide layer from the second collector region comprises removing a portion of the first oxide layer below the nitride layer to expose the base electrode stack; and forming the second epitaxial layer comprises forming the second epitaxial layer with a portion of the second epitaxial layer underneath the nitride layer and in contact with the base electrode stack.

8. The method of claim 1 further comprising removing the second mask layer in the first emitter window following removal of the first oxide layer from the second collector region in the second emitter window and prior to forming the second epitaxial layer, wherein the second oxide layer over the first collector region in the first emitter window prevents growth of the second epitaxial layer in the first emitter window.

9. The method of claim 1 wherein a first silicon region extends over the first collector region in the first emitter window, a second silicon region extends over the second collector region in the second emitter window, and the method further comprises forming a selectively implanted collector in the second silicon region above the second collector region, wherein the second mask layer prevents formation of the selectively implanted collector in the first silicon region above the first collector region.

10. The method of claim 1 further comprising removing the second oxide layer from the first epitaxial layer in the first emitter window following formation of the second epitaxial layer.

11. The method of claim 1 further comprising:

selecting a first epitaxial growth profile for the first epitaxial layer; and selecting a second epitaxial growth profile for the second epitaxial layer, the second epitaxial growth profile differing from the first epitaxial growth profile.

12. The method of claim 1 further comprising:

selecting a first doping profile for the first collector region;

incorporating the first doping profile at the first collector region;

selecting a second doping profile for the second collector region, the second doping profile differing from the first doping profile; and incorporating the second doping profile at the second collector region.

13. The method of claim 1 wherein providing the substrate comprises providing at least one of the first and second emitter windows with a selectively implanted collector formed in a silicon region above at least one of the first and second collector regions.

14. A method of manufacturing a semiconductor component comprises:

providing a substrate having first and second bipolar transistors partially formed therein, a base electrode stack formed over each of the first and second bipolar transistors, a first emitter window formed in the base electrode stack over a first collector region of the first bipolar transistor, and a second emitter window formed in the base electrode stack over a second collector region of the second bipolar transistor, wherein a nitride layer covers a sidewall of the base electrode stack in each of the first and second emitter windows and a first oxide layer extends over the first and second collector regions;

forming a first mask layer over the first oxide layer in the second emitter window;

removing the first oxide layer from the first collector region in the first emitter window;

removing the first mask layer from the second emitter window following removing the first oxide layer from the first collector region;

forming a first epitaxial layer in the first emitter window following removal of the first oxide layer from the first collector region, wherein the first oxide layer in the second emitter window prevents growth of the first epitaxial layer in the second emitter window;

forming a second oxide layer over the first epitaxial layer in the first emitter window;

forming a second mask layer over the second oxide layer and the first epitaxial layer in the first emitter window;

removing the first oxide layer from the second collector region in the second emitter window;

removing the second mask layer in the first emitter window following removal of the first oxide layer from the second collector region in the second emitter window;

forming a second epitaxial layer in the second emitter window following removal of the first oxide layer from the second collector region, wherein the second oxide layer over the first collector region in the first emitter window prevents growth of the second epitaxial layer in the first emitter window; and removing the second oxide layer from the first epitaxial layer in the first emitter window following formation of the second epitaxial layer.

15. The method of claim 14 further comprising:

selecting a first epitaxial growth profile for the first epitaxial layer; and selecting a second epitaxial growth profile for the second epitaxial layer, the second epitaxial growth profile differing from the first epitaxial growth profile.

16. The method of claim 14 further comprising:

selecting a first doping profile for the first collector region;

implementing the first doping profile at the first collector region;

selecting a second doping profile for the second collector region, the second doping profile differing from the first doping profile; and implementing the second doping profile at the second collector region.

17. A method of manufacturing a semiconductor component comprises:

providing a substrate having the first and second bipolar transistors partially formed therein, a base electrode stack formed over each of the first and second bipolar transistors, a first emitter window formed in the base electrode stack over a first collector region of the first bipolar transistor, and a second emitter window formed in the base electrode stack over a second collector region of the second bipolar transistor, wherein a nitride layer covers a sidewall of the base electrode stack in each of the first and second emitter windows and a first oxide layer extends over the first and second collector regions;

forming a first mask layer over the first oxide layer in the second emitter window;

removing the first oxide layer from the first collector region in the first emitter window;

selecting a first doping profile for the first collector region;

implementing the first doping profile at the first collector region;

selecting a first epitaxial growth profile for a first epitaxial layer;

forming the first epitaxial layer in the first emitter window following removal of the first oxide layer from the first collector region;

forming a second oxide layer over the first epitaxial layer in the first emitter window;

forming a second mask layer over the second oxide layer and the first epitaxial layer in the first emitter window;

removing the first oxide layer from the second collector region in the second emitter window;

selecting a second doping profile for the second collector region;

implementing the second doping profile at the second collector region;

selecting a second epitaxial growth profile for a second epitaxial layer; and forming the second epitaxial layer in the second emitter window following removal of the first oxide layer from the second collector region, wherein at least one of the second epitaxial growth profile differs from the first epitaxial growth profile and the second doping profile differs from the first doping profile.

18. The method of claim 17 wherein:

the first oxide layer in the second emitter window prevents growth of the first epitaxial layer in the second emitter window; and the second oxide layer in the first emitter window prevents growth of the second epitaxial layer in the first emitter window.

19. The method of claim 17 wherein a first silicon region extends over the first collector region in the first emitter window, a second silicon region extends over the second collector region in the second emitter window, and implementing the first doping profile comprises forming a selectively implanted collector in the first silicon region above the first collector region, wherein the first mask layer prevents formation of the selectively implanted collector in the second silicon region above the second collector region.

20. The method of claim 17 wherein a first silicon region extends over the first collector region in the first emitter window, a second silicon region extends over the second collector region in the second emitter window, and implementing the second doping profile comprises forming a selectively implanted collector in the second silicon region above the second collector region, wherein the second mask layer prevents formation of the selectively implanted collector in the first silicon region above the first collector region.

* * * * *